United States Patent
Purcell et al.

(10) Patent No.: US 9,992,905 B2
(45) Date of Patent: Jun. 5, 2018

(54) SUPPORTING INPUT/OUTPUT (I/O) CONNECTIVITY FOR A PRINTED CIRCUIT ASSEMBLY (PCA) IN A HOT AISLE CABLING OR A COLD AISLE CABLING ARRANGEMENT

(71) Applicant: HEWLETT PACKARD ENTERPRISE DEVELOPMENT LP, Houston, TX (US)

(72) Inventors: Brian T. Purcell, Tomball, TX (US); Zheila N. Madanipour, Houston, TX (US); Chandler Ray Harris, Houston, TX (US); Robert Allen Voss, Houston, TX (US); Michael Bourg, Tomball, TX (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 21 days.

(21) Appl. No.: 15/310,576

(22) PCT Filed: May 30, 2014

(86) PCT No.: PCT/US2014/040302
§ 371 (c)(1),
(2) Date: Nov. 11, 2016

(87) PCT Pub. No.: WO2015/183314
PCT Pub. Date: Dec. 3, 2015

(65) Prior Publication Data
US 2017/0105308 A1   Apr. 13, 2017

(51) Int. Cl.
*H05K 7/14* (2006.01)

(52) U.S. Cl.
CPC ......... *H05K 7/1492* (2013.01); *H05K 7/1491* (2013.01)

(58) Field of Classification Search
None
See application file for complete search history.

(56) References Cited

U.S. PATENT DOCUMENTS 6,544,057 B1 * 4/2003 Stremick ................ H01R 35/02
                                                          439/162
7,272,013 B1    9/2007 Sivertsen
(Continued)

FOREIGN PATENT DOCUMENTS

CN  102844725 A   12/2012
TW  201311118 A    3/2013

OTHER PUBLICATIONS

International Searching Authority, The International Search Report and the Written Opinion, dated Feb. 24, 2015, 10 Pages.
(Continued)

*Primary Examiner* — Xanthia C Cunningham
(74) *Attorney, Agent, or Firm* — Fabian Vancott

(57) ABSTRACT

Supporting input/output (I/O) connectivity for a printed circuit assembly (PCA) in a hot aisle cabling or a cold aisle cabling arrangement includes a chassis, the chassis being connected to a rack in a data center, and a PCA slidably connected to the chassis via a tray, in which the PCA comprises a number of bill of material (BOM) options to customize the PCA and a single basic input/output system (BIOS) image, and in which the PCA is physically shifted on the chassis to accommodate a cold aisle cabling or a hot aisle cabling arrangement of the data center.

15 Claims, 7 Drawing Sheets

(56) References Cited

U.S. PATENT DOCUMENTS

| | | | |
|---|---|---|---|
| 7,855,938 B2* | 12/2010 | Hoelsaeter | G11B 15/6835 369/30.4 |
| 8,379,388 B2* | 2/2013 | Chen | H05K 7/1491 165/104.33 |
| 8,472,183 B1 | 6/2013 | Ross et al. | |
| 9,781,859 B1* | 10/2017 | Wishman | H05K 7/1491 |
| 2009/0152216 A1 | 6/2009 | Champion et al. | |
| 2010/0172076 A1* | 7/2010 | Cravens | G06F 1/183 361/679.02 |
| 2011/0310550 A1 | 12/2011 | Xu et al. | |
| 2012/0020006 A1 | 1/2012 | Xu et al. | |
| 2012/0069514 A1* | 3/2012 | Ross | H05K 7/20727 361/679.33 |
| 2012/0111534 A1* | 5/2012 | Chen | H05K 7/20736 165/80.3 |
| 2012/0120596 A1 | 5/2012 | Bechtolsheim | |
| 2014/0078668 A1 | 3/2014 | Goulden et al. | |
| 2014/0085789 A1 | 3/2014 | Ning et al. | |
| 2014/0098492 A1 | 4/2014 | Lam et al. | |

OTHER PUBLICATIONS

Xu, Y. et al., Analyzing the Cooling Behavior of Hot and Cold Aisle Containment in Data Centers, (Research Paper), Sep. 9-11, 2013, pp. 685-689.

\* cited by examiner

SUPPORTING INPUT/OUTPUT (I/O) CONNECTIVITY FOR A PRINTED CIRCUIT ASSEMBLY (PCA) IN A HOT AISLE CABLING OR A COLD AISLE CABLING ARRANGEMENT

BACKGROUND

Data centers are used to store large amounts of data for customers. Often, data centers include a row of one or more racks to physically place computer systems, such as servers and hard drives, on the racks. The computer systems allow the data center to process and store the large amounts of data for the customers as well as perform other functions. Further, the computer systems may include a printed circuit assembly (PCA), such as a motherboard, which includes input/output (I/O) connectors, power supply connectors, memory, and central processing units (CPUs). Depending on an arrangement of the data center and the customer's specific needs, the PCA is designed and arranged for cold aisle cabling or hot aisle cabling.

BRIEF DESCRIPTION OF THE DRAWINGS

The accompanying drawings illustrate various examples of the principles described herein and are a part of the specification. The examples do not limit the scope of the claims.

Throughout the drawings, identical reference numbers designate similar, but not necessarily identical, elements.

DETAILED DESCRIPTION

Figure 1A:
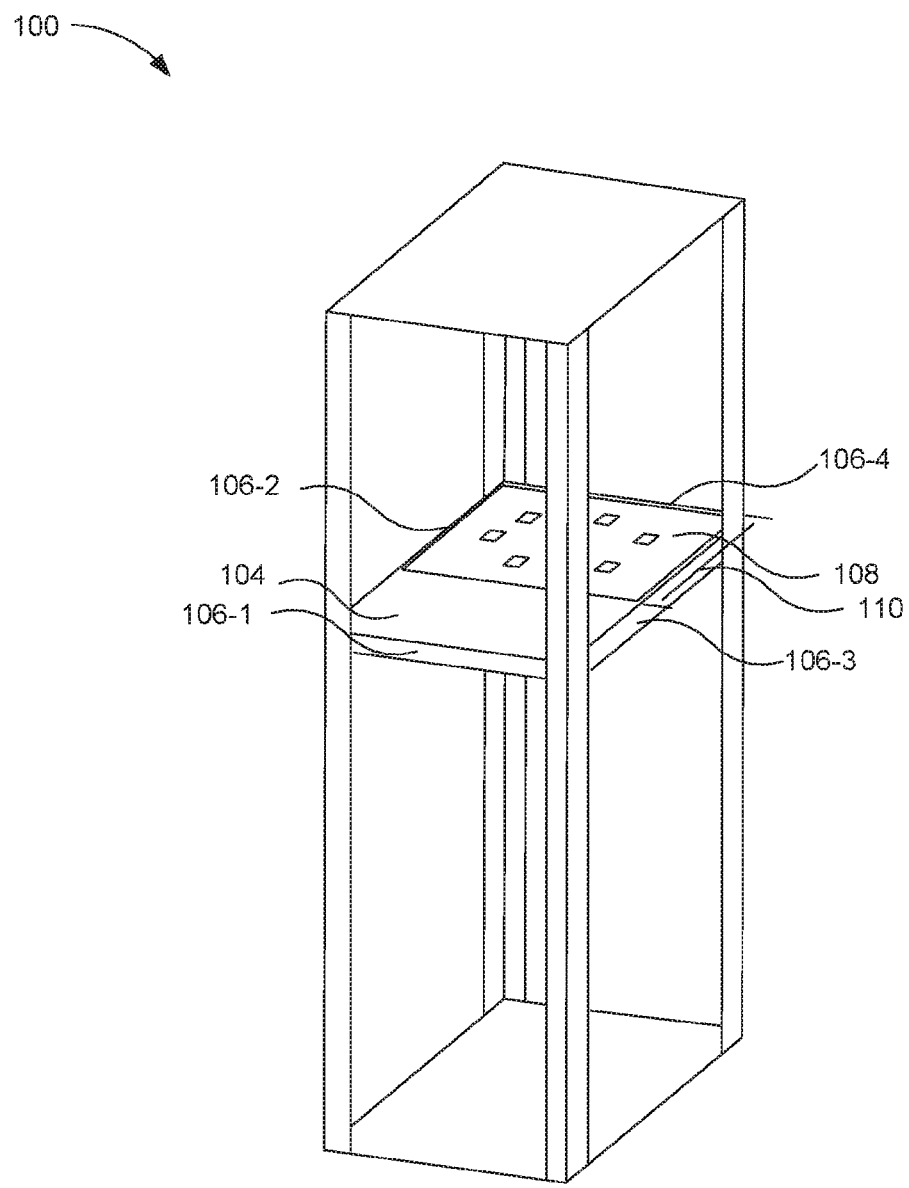
FIG. 1A is a diagram of an example of a rack with a printed circuit assembly (PCA) supporting input/output (I/O) connectivity for hot aisle cabling, according to one example of principles described herein.

As mentioned above, data centers are used to store large amounts of data for customers. Often, data centers include a row of one or more racks to physically place computer systems, such as servers and hard drives, on the racks. The computer systems allow the data center to process and store the large amounts of data for the customers as well as perform other functions. Further, the computer systems may include a printed circuit assembly (PCA), such as a motherboard, which includes input/output (I/O) connectors, power supply connectors, busses, memory, and central processing units (CPUs). Depending on an arrangement of the data center and the customer's specific needs, the PCA is designed and arranged for cold aisle cabling or hot aisle cabling.

For some customers, purchasing a standard PCA does not meet their needs. In one example, the standard PCA may lead to a non-optimized I/O for a particular application of the PCA. For example, the bus routing in a standard PCA may not have been optimized for a customer's specific I/O workloads. This leads to slower throughput, higher latency, and overall lower performance of the PCA. Further, non-optimized I/O for the PCA leads to increased cost. For example, purchasing a standard PCA, customers cannot remove components or options they do not need. As a result, the customer pays for features or hardware they won't use.

Further, some customers desire a specific PCA designed around their own workloads rather than achieving their needs by using existing available hardware such as a standard PCA. As will be described below, designing a specific PCA, such as a motherboard, for every customer is not practical. Further, some data centers use hot aisle cabling arrangements, but other data centers use cold aisle cabling arrangements.

Designing a PCA for each customer can lead to process inefficiency. For example, if a specific PCA is designed for each customer, this involves several dedicated development teams. Further, a hardware vendor may be slow to respond to customer requests. As a result, the hardware vendor may develop a limited number of PCAs at one time with existing resources.

Further, PCA validation can become very complex for each specific PCA. Each specific PCA would need a full qualification to ensure proper operation. This may be a time consuming and a burdensome task to validate each specific PCA. Further, developing hardware for each specific PCA is expensive since more development and test teams are needed to support this effort.

The present invention describes a system and a method for supporting I/O connectivity for a PCA in a hot aisle cabling or a cold aisle cabling arrangement. Such a system and method includes a chassis, the chassis being connected to a rack in a data center, and a PCA slidably connected to the chassis via a tray, in which the PCA comprises a number of bill of material (BOM) options to customize the PCA and a single basic input/output system (BIOS) image, and in which the PCA is physically shifted on the chassis to accommodate a cold aisle cabling or a hot aisle cabling arrangement of the data center.

In the present specification and in the appended claims, the term "BOM option" is meant to be understood broadly as a mechanism to connect one component of the PCA to another component of the PCA. For example, depending on the design of the PCA, a BOM option may be used to connect a rear compute device to a southbridge or the BOM option may be used to connect a front compute device to a southbridge. In one example, the BOM option uses passive components such as resistors and capacitors to change the route of the busses to connect one component of the PCA to another component of the PCA.

In the present specification and in the appended claims, the term "cold aisle cabling" is meant to be understood broadly as a side of a rack in a data center in which an air handling system intakes air from. Further, cold aisle cabling may refer to the side in which cables, such as network cables, are attached to the PCA as well as other devices. In one example, the cold aisle cabling may be on an opposite side of the rack as the hot aisle cabling.

In the present specification and in the appended claims, the term "hot aisle cabling" is meant to be understood broadly as a side of a rack in a data center in which an air handling system exhausts air from. Further, hot aisle cabling may refer to the side in which cables, such as network cables, are attached to the PCA as well as other devices. In one example, the hot aisle cabling may be on an opposite side of the rack as the cold aisle cabling.

In the present specification and in the appended claims, the term "compute device" is meant to be understood broadly as hardware that carries out the instructions of a computer program by performing basic arithmetical, logical, and I/O operations of the PCA. In one example, the compute device may be a processor such as a CPU. Further, the PCA may include a front compute device for cold aisle cabling and a rear compute device for hot aisle cabling.

Further, as used in the present specification and in the appended claims, the term "a number of" or similar language is meant to be understood broadly as any positive number comprising 1 to infinity; zero not being a number, but the absence of a number.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described in connection with that example is included as described, but may not be included in other examples.

Referring now to the figures, FIG. 1A is a diagram of an example of a rack with a PCA supporting I/O connectivity for hot aisle cabling, according to one example of principles described herein. As will be described in FIG. 1A and FIG. 1B, depending on an arrangement of the data center and the customer's specific needs, the PCA is physically shifted to the front of the chassis for cold aisle cabling or to the rear of the chassis for hot aisle cabling.

As illustrated in FIG. 1A, the rack (100) may include a chassis (104). In one example, the chassis (104) may be connected to the rack (100) via a number of common methods and techniques. For example, the chassis (104) may be connected to the rack (100) via welding, nuts and bolts, other methods and techniques, or combinations thereof.

In one example, the chassis (104) may be defined by a number of sides (106). For example, the chassis (104) may be defined by a front side (106-1), a right side (106-2), a left side (106-3), and a rear side (106-4). In this example, the front side (106-1) and the rear side (106-4) may be equal lengths of measurement. For example, the front side (106-1) and the rear side (106-4) may measure 24 inches.

Further, the right side (106-2) and the left side (106-3) of the chassis (104) may be equal lengths of measurement. For example, the right side (106-2) and the left side (106-3) of the chassis (104) may be 42 inches.

In one example, the right side (106-2) and the left side (106-3) of the chassis (104) may be equal lengths of measurement as the front side (106-1) and the rear side (106-4). In another example, the right side (106-2) and the left side (106-3) of the chassis (104) may be different lengths of measurement as the front side (106-1) and the rear side (106-4).

As illustrated in FIG. 1A, the rack (100) includes a PCA (108). As will be described in later parts of this specification, the PCA (108) includes a number of components such as a front compute device, a rear compute device, a DMI bus, a number of BOM options to customize the PCA, a southbridge, PCIe, memory devices, a single BIOS image, a number of I/O connectors to provide I/O balance and affinity for the PCA, a management device, and a power supply. In one example, the PCA (108) is slidably connected to the chassis (104). In one example, a series of trays and/or pans slide into the chassis (104) to accommodate the PCA (108). In this example, the PCA (108) is installed into a pan/tray and the pan/tray slides in and out of the chassis (104). The location within the pan/tray specifies where the PCA (108) will reside relative to the chassis (104). The PCA (108) is secured to the tray and/or pan by screws, latches, or other mechanism. Further, the tray inserts into the chassis (114) and is secured by a latch and/or handle or screws. As will be described later on in this specification the PCA (108) is physically shifted on the chassis to accommodate a cold aisle cabling or a hot aisle cabling arrangement of the data center. As illustrated, the PCA (108) is physically shifted to a rear side (106-4) of the chassis (104) for the hot aisle cabling arrangement of the data center.

The PCA (108) may be physically shifted to a rear side (106-4) of the chassis (104) for the hot aisle cabling arrangement of the data center because a length (110) of the PCA (100) is less than a length, as defined by of the length measurement of the right side (106-3) and the left side (106-2), of the chassis (104) to allow the PCA (108) to be physically shifted on the chassis (104). In this case to the rear of the chassis (104).

Further, once the PCA (108) is physically shifted on the chassis (104), the PCA may be secured to the chassis (104). For example, the PCA (108) may be secured to the chassis (104) via a number of common methods and techniques such as using a number of screws to secure the PCA (108) to the chassis (104) as mentioned above.

Figure 1B:
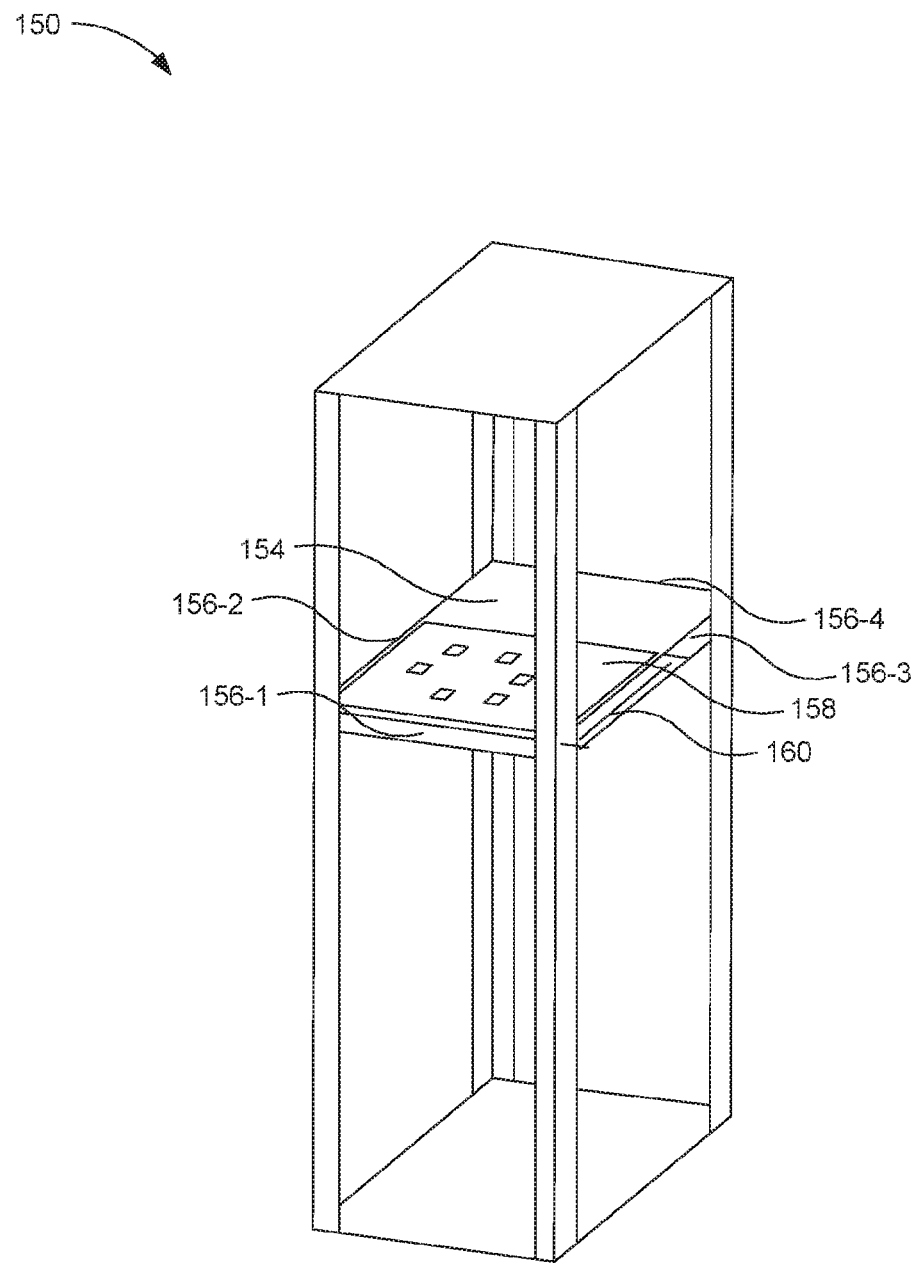
FIG. 1B is a diagram of an example of a rack with a PCA supporting I/O connectivity for cold aisle cabling, according to one example of principles described herein.

FIG. 1B is a diagram of an example of a rack with a PCA supporting I/O connectivity for cold aisle cabling, according to one example of principles described herein. As mentioned above, depending on an arrangement of the data center and the customer's specific needs, the PCA is physical shifted to support cold aisle cabling or hot aisle cabling.

As illustrated in FIG. 1B, the rack (150) may include a chassis (154). As mentioned above, the chassis (154) may be connected to the rack (150) via a number of common methods and techniques. For example, the chassis (154) may be connected to the rack (150) via welding, nuts and bolts, other methods and techniques, or combinations thereof.

As mentioned above, the chassis (154) may be defined by a number of sides (156). For example, the chassis (154) may be defined by a front side (154-1), a right side (156-2), a left side (156-3), and a rear side (156-4). In this example, the front side (156-1) and the rear side (156-4) may be equal lengths of measurement. For example, the front side (156-1) and the rear side (156-4) may measure 24 inches.

Further, the right side (156-2) and the left side (156-3) of the chassis (154) may be equal lengths of measurement. For example, the right side (156-2) and the left side (156-3) of the chassis (154) may be 42 inches.

In one example, the right side (156-2) and the left side (156-3) of the chassis (154) may be equal lengths of measurement as the front side (156-1) and the rear side (156-4). In another example, the right side (156-2) and the left side (156-3) of the chassis (154) may be different lengths of measurement as the front side (156-1) and the rear side (156-4).

As illustrated in FIG. 1B, the rack (150) includes a PCA (158). As will be described in later parts of this specification the PCA (158) includes a number of components such as a front compute device, a rear compute device, a DMI bus, a number of BOM options to customize the PCA, a southbridge, PCIe, memory devices, a single BIOS image, a number of I/O connectors to provide I/O balance and affinity for the PCA, a management device, and a power supply. In one example, the PCA (158) is slidably connected to the chassis (154). As will be described later on in this specification the PCA (108) is physically shifted on the chassis to accommodate a cold aisle cabling or a hot aisle cabling arrangement of the data center. As illustrated, the PCA (108) is physically shifted to a front side (156-1) of the chassis (154) for the cold aisle cabling arrangement of the data center.

The PCA (158) may be physically shifted to the front side (156-1) of the chassis (154) for the cold aisle cabling arrangement of the data center because a length (160) of the PCA (158) is less than a length, as defined by the of length measurement of the right side (156-3) and the left side (156-2), of the chassis (154) to allow the PCA (158) to be physically shifted on the chassis (154). In this case to the front of the chassis (154).

Further, once the PCA (158) is physically shifted on the chassis (154), the PCA may be secured to the chassis (154). For example, the PCA (158) may be secured to the chassis (154) via a number of common methods and techniques such as using a number of screws to secure the PCA (158) to the chassis (154).

Figure 2:
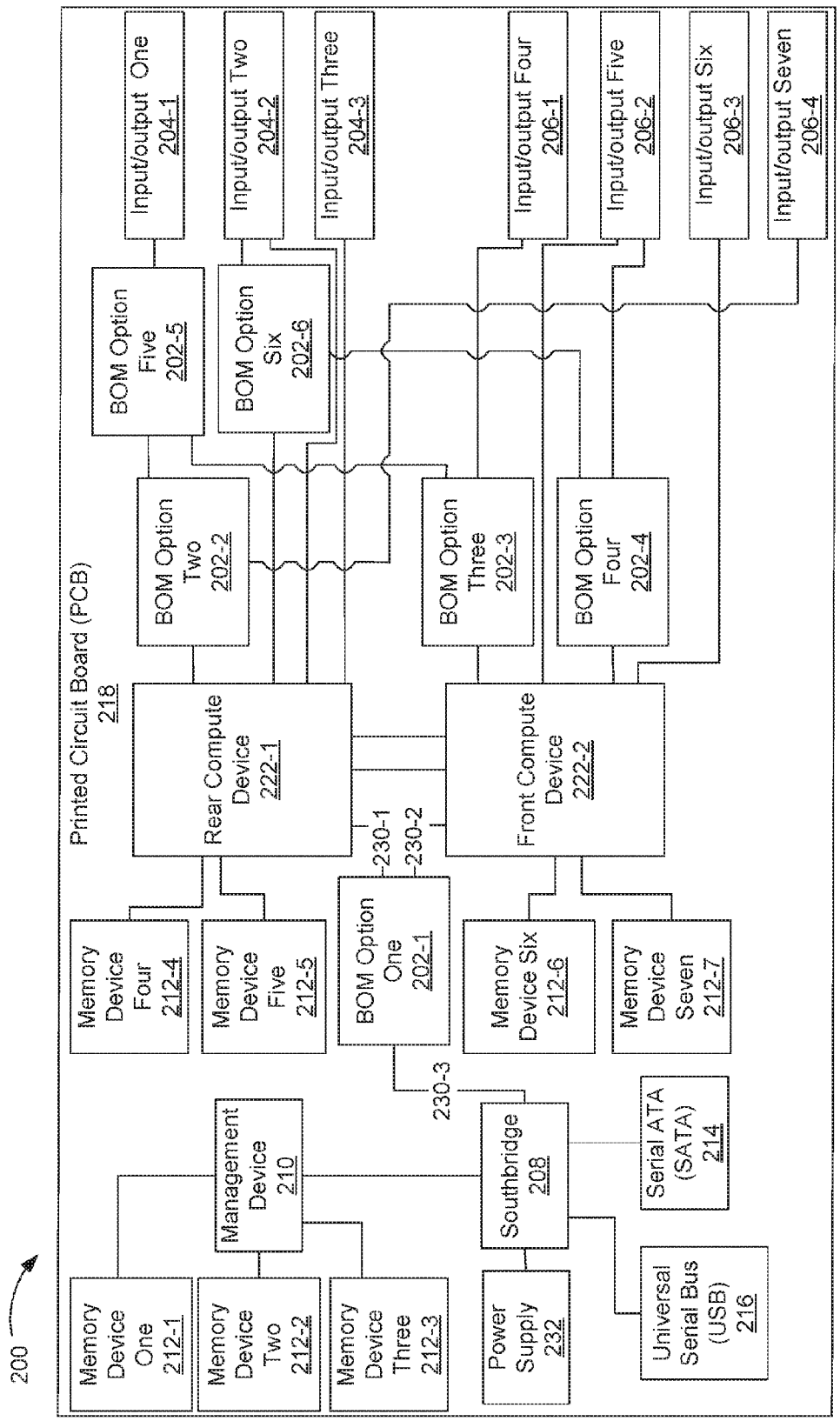
FIG. 2 is a diagram of an example of a PCA supporting I/O connectivity for hot aisle cabling or a cold aisle cabling, according to one example of principles described herein.

FIG. 2 is a diagram of an example of a PCA supporting I/O connectivity for hot aisle cabling or cold aisle cabling, according to one example of principles described herein. As will be described below, FIG. 2 illustrates a PCA that supports I/O connectivity in either hot aisle or cold aisle data center arrangements and balances device connectivity within that arrangement.

As illustrated in FIG. 2, the PCA (200) includes a PCB (218). In one example, a PCB mechanically supports and electrically connects electronic components using conductive tracks, pads, and other features etched from copper sheets laminated onto a non-conductive substrate. PCBs can be single sided, such as one copper layer, double sided, such as two copper layers, or multi-layer. Conductors on different layers are connected with plated-through holes called vias. Further, a PCB populated with electronic components is referred to as a PCA in this specification.

In one example, the cost of the PCB (218) is a significant portion of PCA's cost. In order to keep the PCB's cost low, the PCA's length is chosen to be smaller than the chassis length as described above. Further, in order to support both hot aisle cabling and cold aisle cabling arrangements, the PCA (200) is physically shifted to the front of the chassis for cold aisle cabling arrangements or physically shifted to the rear of the chassis for hot aisle cabling arrangements. This allows the bus lengths, indicated as solid lines connecting the different components, of the PCA (200) to be minimized. By minimizing the lengths of the busses, this improves signal integrity, bandwidth, and throughput of the PCA (200). In one example, this applies to a footprint of the BOM options (202) that is used to connect the bus from one set of components to another set of components, without having signal integrity issues.

To respond quickly to the needs of different customers, it is desirable to have a single PCA that can support both hot aisle cabling and cold aisle cabling arrangements. A PCA as long as the chassis would allow connectivity to the hot aisle cabling or cold aisle cabling by changing the BOM option (202) installation, but it would also add significant and unnecessary cost to the PCA. If the PCA was made smaller than the chassis, the cost decreases drastically, but then the question becomes, where does one place the PCA within the chassis. As mentioned above, the physical location of the PCA (200) offers a natural affinity to where I/O resources and external connectivity are desired. This will pull resources, such as lanes, to one area of the PCA (200). For example, to the front side of the PCA (200). When the PCA (200) is located at the other end of the chassis, I/O resources and connectivity have a natural affinity to the other end of the PCA (200). For example, to the rear side of the PCA (200). As a result, the PCA (200) is physically shifted to the rear of the chassis for hot aisle cabling arrangements or to the front of the chassis for cold aisle cabling arrangements as described in FIGS. 1A and 1B.

Additionally, there are a finite number of resources, such as PCI express buses and PCIe lanes, available per compute device (222). PCI express buses and PCIe lanes are part of a high-speed serial computer expansion bus standard designed to replace older bus standards. PCIe has numerous improvements over the other bus standards, including higher maximum system bus throughput, lower I/O pin count and smaller physical footprint, better performance-scaling for bus devices, a more detailed error detection and reporting mechanism, and native hot-plug functionality.

If a PCA supports both hot aisle cabling and cold aisle cabling and has dedicated connections to all I/O devices, the full bandwidth and performance of the compute devices will never be achieved. For example, in a cold aisle arrangement, the devices supporting the hot aisle configuration will not be used. This results in resources that are left unused causing an unbalanced I/O. As a result, FIG. 2 illustrates a PCA (200) that supports I/O connectivity in either hot aisle cabling or cold aisle cabling arrangements for data centers and balances device connectivity within that arrangement.

As illustrated, the PCA (200) includes a number of components integrated on the PCB (218). In one example, the components may include a front compute device (222-2) and a rear compute device (222-1). In one example, the compute devices (222) may be a CPU that executes program code and allows the PCA (200) to operate as intended. In one example, the computer program code, read processes, and write processes may be stored in memory device four (212-4) and memory device five (212-5) for all operations of the rear compute device (222-1). Further, the computer program code, read processes, and write processes may be stored in memory device six (212-6) and memory device seven (212-7) for all operations of the front compute device (222-2). In one example, memory device four (212-4), memory device five (212-5), memory device six (212-6), and memory device seven (212-7) may be double data rate three type (DDR3) memory.

In one example, a customer may desire to have the PCA (200) operate with both compute devices (222). In this example, one of the compute devices (222) may be used for a bootstrap process. Depending on the intended operation of the PCA (200), the rear compute device (222-1) may be used for the bootstrap process or the front compute device (222-2) may be used for the bootstrap process. In this example, the bootstrap process may be used to run the PCA (200) upon startup. As a result, the PCA (200) indicates if the front compute device (222-2) is in a boot path for a boot strap process or the rear compute device (222-1) is in the boot path for the boot strap process.

As illustrated in FIG. 2, the PCA (200) includes a DMI bus (230). The DMI bus (230) connects one of the compute devices (222) to the southbridge (208) depending on the boot path. In one example, the DMI bus (230) has the ability to connect to both compute devices (222) so that either compute device (222) can be used in the boot path. To minimize routing channels for the PCA (200), the DMI bus (230) converges to one area in the PCB (218) from the compute devices (222). From this area, there is a single DMI bus (230-3) connecting to the southbridge (208). Using BOM option one (202-1), the PCA (200) dictates which compute device (222) is in the boot path by making the connection to the southbridge (208). In one example, the BOM options (202) may include passive components such as resistors and capacitors to change the route of the busses.

Further, signal integrity is not compromised due to the way the layout has been implemented on the PCA (200). For example, the footprints for the BOM options (202) are shared so no stub is present in the signal. As a result, the length of the DMI bus (230) is minimized to improve signal integrity, bandwidth, throughput, or combinations thereof.

As illustrated in FIG. 2, the PCA (200) includes a number of BOM options (202). As mentioned above, a shared footprint for each of the BOM options (202) allows the front compute device (222-2) or the rear compute device (222-1) to connect to the southbridge (208) and support I/O connectivity. For example, the BOM options (202) allow the compute devices (222) to connect to a number of I/O connectors (204, 206). More information about the BOM options (202) will be described in later parts of this specification.

As mentioned above, the PCA (200) includes the southbridge (208). The southbridge (208) is a computer chip in the core logic chipset integrated on the PCA (200). In one example, the southbridge (208) may connect via a number of busses to a universal serial bus (USB) (216), a serial ATA (SATA) (214), and power controls such as a power supply (232).

Further, the southbridge (208) may connect to a management device (210). The management device (210) manages all operations of the PCA (200) upon startup. In one example, the management device (210) access a number of memory devices such as memory device one (212-1), memory device two (212-2), and memory device three (212-3).

In one example, memory device one (212-1) may be non-volatile random-access memory (NVRAM) that may aid the management device's operations upon startup. Further, memory device two (212-2) may be a read only memory (ROM) that may aid the management device's operations upon startup. Further, memory device three (212-3) may be read only memory (ROM) for the PCA (200) to aid the management device's operations upon startup.

In one example, memory device three (212-3) may store the PCA's BIOS. In one example, it is desirable to have a single BIOS image that can be used for all designs of the PCA (200). The fundamental purpose of the BIOS is to initialize and test the PCA's components and to load a bootloader or an operating system from a mass memory device. The BIOS additionally provides an abstraction layer for the hardware, such as a consistent way for application programs and operating systems to interact with keyboards, displays, and other I/O devices. In one example, the BIOS understands what hardware will be present at boot time via resistors for the BOM options (202). For example, information for the PCA's arrangement can be discovered by register reads, sampling of pin state, or dynamic discovery of relative device or bus enumeration within the topology. Further, resistors are used to change the individual pin states of configuration straps and/or identifiers. BIOS then reads registers that propagate and/or sample the pin state information to the software. As a result, the BIOS will take the appropriate code path for a given design of the PCA (200).

As illustrated in FIG. 2, the PCA (200) includes a number of I/O connectors (204, 206) to provide I/O balance and affinity for the PCA. In one example, I/O one (204-1) and I/O three (204-3) may be used for hot aisle cabling for connecting network cables. I/O two (204-2) may be used for hot aisle cabling for a network interface controller (NIC). In one example, a NIC is a computer hardware component that connects the PCA (200) to a computer network. Further, I/O four (206-1) and I/O five (206-2) may be used for cold aisle cabling for connecting network cables. In one example, I/O four (206-1) may be a local area network on motherboard (LOM) I/O. I/O six (206-3) and I/O seven (206-4) may be used for connecting the PCA (200) to external daughter boards located above or below the PCA (200) on a rack. As illustrated, the I/O connectors (204, 206) may connect to the compute devices (222) via the BOM options (202). More information about the I/O connectors (204, 206) will be described in later parts of this specification.

Often, a PCA may be designed around a single or specific design. If bus routing changes for device connectivity or topology, because a customer's workload needs changed, it forces a physical PCA layout change and oftentimes causes a domino effect of various areas of the PCA changing physically. These physical changes affect the electrical behavior of circuits, such as the response characteristics of voltage regulators and other circuits, for example, sense point and/or signal changes, capacitor placement, control/feedback circuits. Such changes also force a significant amount of re-qualification and full regression testing to ensure the circuits are within specification. As a result, the PCA (200) supports source I/O connectivity. For example, in cold aisle cabling, the natural affinity of the I/O is to the front processor, whereas in hot aisle cabling, the natural affinity of the I/O is the rear processor. In order to support a single processor design, the natural affinity of the base CPU is different between cold aisle cabling and hot aisle cabling. As a result, the boot path would naturally need to be changed too as described above.

Further, the PCA (200) supports external cabled I/O devices options for connectivity. As mentioned above, the location of a device that connects external to the chassis needs to be located according to the cabling arrangement. In other words, in a hot aisle cabling arrangement, the I/O device should be placed at the rear of the PCA so that the cabling from the rear plugs into the device directly. This minimizes the trace lengths within the PCB (218) as well as the cable length. Further, it also implies that the PCA is to support multiple I/O devices of the same or similar type. For example, one I/O device in the front and one I/O device in the rear. The PCA (200) for a given arrangement will dictate which I/O (204, 206) should be installed and which should be uninstalled as will be described in FIGS. 4A and 4B.

Further, the PCA (200) supports flexible I/O and power options. For example, the PCA (200) has flexibility to change the power supplied to a connector for daughter boards via the BOM options (202). This allows support of devices off of main power or auxiliary power depending upon the desired option.

For example, the PCA (200) has a connector in the rear that supports different power depending on the cabling arrangement. For a cold aisle cabling arrangement, the daughter board supports a standard PCIe slot, which needs a main power of 12 volts (V). For a hot aisle hot aisle cabling arrangement, the daughter board supports NIC modules and they need 12 V of auxiliary power. In one example the power connected to the 12 V signals is connected to the main power from the PCA's power supply (232) for the cold aisle cabling arrangement and to auxiliary from the PCA's power supply (232) for the hot aisle cabling arrangement.

As a result, the BOM options (202) allows a change to a power supply to an I/O interface module, the change permitting the power supply to be routed via a main power supply for the cold aisle cabling or the power supply to be routed via an auxiliary power supply for the hot aisle cabling. This applies to an I/O expansion slot and particularly to a networking device, standard PCIe option card such as storage, networking, memory, and among others.

Further, the PCA (200) supports reusing unused resources such as lanes. If the compute devices (222) had an endless number of resources, the PCA (200) could have dedicated connections to all I/O devices and the PCA (200) would dictate which devices should be installed for a given design. As a result, full bandwidth could be achieved.

However, there are a finite number of lanes for any compute device. If specific components are not installed in a PCA (200), then resources will be left unused and throughput is reduced. In order to maximize the use of the resources available, the PCA (200) supports certain busses to connect to more than one I/O device, but only one connection is made for a given PCA. Similar to the DMI bus routing, the PCIe bus from the compute devices (222) routes to a common area. From there, an independent portion of the bus allows connectivity to each desired destination device. A set of passive components, such as resistors or capacitors, and depending on bus direction, are installed on the BOM options (202). As a result, the connection to the desired destination device is made via the BOM options (202). Further, each of the BOM options (202) may or may not be installed to create a specific PCA assembly. As a result, the number of BOM options is installed on the PCB (218) to customize the PCA (200).

Further, signal integrity is not compromised due to the way the layout of the PCA (200) has been implemented as described above. For example, a bus that connects the front compute device (202-2) to I/O five (206-2) also has the flexibility to connect to a device in the rear of the chassis for a hot aisle configuration since I/O five (206-2) is not installed in a hot aisle cabling arrangement.

In order to add flexibility to the PCA (200), some resources, such as lanes, are routed to a connector. From the connector, different daughter boards supporting different configurations can be installed, and each daughter board has a different identification so the BIOS of the PCA (200) can comprehend the arrangement. There are daughter boards that support hot aisle arrangements and others that support cold aisle arrangements. For example, I/O six (206-3) and I/O seven (206-4) may be used to connect the PCA (200) to daughter boards. In one example, the daughter boards may be located above or below the PCA (200) on a rack in the data center.

As mentioned above, when the PCA (200) is used in a cold aisle cabling arrangement, the PCA (200) can be shifted all the way to the front of the chassis. This means that an I/O device, such as a NIC, can be placed at the front edge of the PCA (200) and cables can be routed easily from the I/O device connector to the cold aisle.

In one example, for a hot aisle cabling arrangement, the PCA (200) cannot be shifted all the way to the rear of the chassis because of the system power, system management signals, and system fans. However, the PCA (200) may be further shaped to put the I/O (204) at the rear edge of the chassis. But this is where the cabling for the hot aisle is located. In order to make the connection, there may be a daughter board connection to the rear of the chassis to support I/O connectivity for the hot aisle cabling arrangement. Further, the connection may be used to support flexibility of internal expansion for the cold aisle cabling arrangement.

In one example, the PCA (200) will indicate to the BIOS hot aisle cabling arrangement or cold aisle cabling arrangement via resistor options. For example, if a signal for the resistor option is high, then the PCA (200) is arranged for a hot aisle cabling. If the signal for the resistor option is low, then the PCA (200) is arranged for a cold aisle cabling.

Further, the PCA (200) will indicate to the BIOS which compute device (222) is used in the boot path via a resistor option. For a PCA with more than two compute devices, additional signals can be added to cover all possible compute device boot path options.

The PCA (200) will indicate single verses multi-compute devices. Similarly, for customers that do not want to install more than one compute device socket, a single signal is connected to complex programmable logic device (CPLD) to indicate if one or more compute device sockets are installed. For a PCA that needs to differentiate between more than two states for compute devices, additional signals can be added to cover all possible compute device socket options.

Further, the PCA (200) indicates front NIC status. For example, a single signal is connected to the CPLD indicating if the front NIC is installed or not installed. In this example, the front NIC may be I/O five (206-2).

Figure 3:
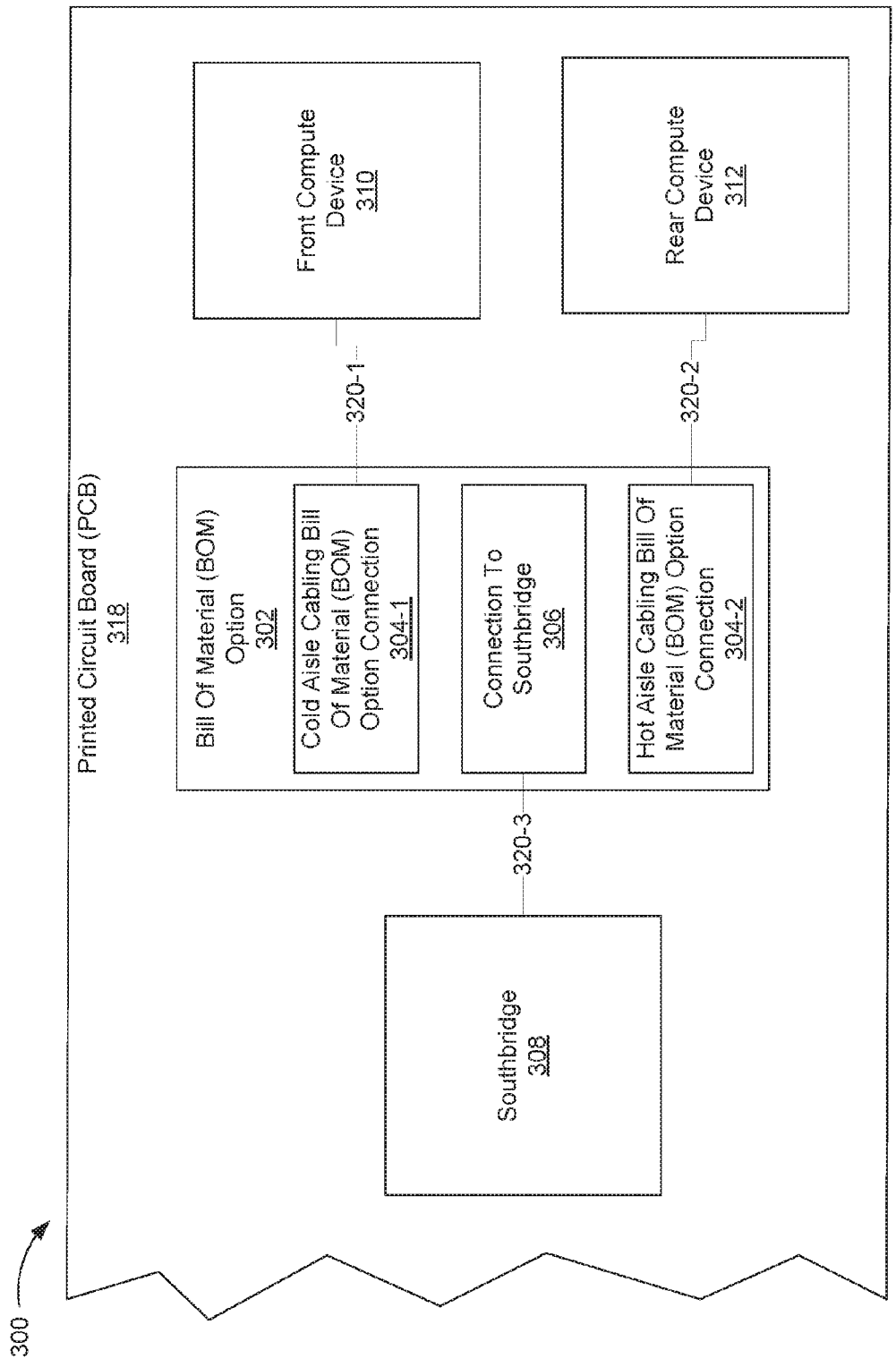
FIG. 3 is a diagram of an example of bill of materials (BOM) option, according to one example of principles described herein.

FIG. 3 is a diagram of an example of a BOM option, according to one example of principles described herein. As mentioned above, each of the BOM options include share a footprint. The shared footprint allows the front compute device or the rear compute device to connect to the southbridge depending on the specific design of the PCA.

As illustrated in FIG. 3, the BOM option (302) includes a cold aisle cabling BOM option connection (304-1). The cold aisle cabling BOM option connection (304-1) represents where the busses (320-1) for the cold aisle cabling connect on the PCA of FIG. 2. In one example, the busses (320-1) may include a DMI bus, PCIe busses, or combinations thereof.

The hot aisle cabling BOM option connection (304-2) represents where the busses (320-2) for the hot aisle cabling connect on the PCA of FIG. 2. In one example, the busses (320-2) may include a DMI bus, PCIe busses, or combinations thereof.

As illustrated in FIG. 3, the BOM option (302) includes a connection to southbridge (306). As a result, the BOM option (302) includes two busses (320-1, 320-2), one for hot aisle cabling and another for cold aisle cabling that converge to one area of the PCB (318) with a single connection to the southbridge.

Depending on the specific application for the PCA, either the cold aisle cabling BOM option connection (304-1) is installed or the hot aisle cabling BOM option connection (304-2) is installed. If the hot aisle cabling BOM option connection (304-2) is installed, then the rear compute device (312) will be connected to the southbridge (308). For example, the rear compute device (312) is connected to the hot aisle cabling BOM option connection (304-2) via bus 320-2. Since the hot aisle cabling BOM option connection (304-2) is installed, the hot aisle cabling BOM option connection (304-2) is connected to the connection to southbridge (306). As illustrated, the southbridge (308) is connected to the connection to southbridge (306) via bus 320-3.

As a result, the rear compute device (312) is connected to the southbridge (308) via the BOM option (302).

If the cold aisle cabling BOM option connection (304-1) is installed, then the front compute device will be connected to the southbridge (308). For example, the front compute device (310) is connected to the cold aisle cabling BOM option connection (304-1) via bus 320-1. Since the cold aisle cabling BOM option connection (304-1) is installed, the cold aisle cabling BOM option connection (304-1) is connected to the connection to southbridge (306). As illustrated, the southbridge (308) is connected to the connection to southbridge (306) via bus 320-3. As a result, the front compute device (310) is connected to the southbridge (308) via the BOM option (302).

While this example has been described with reference to the BOM option being utilized to connecting the front compute device or the rear compute device to the southbridge, a different BOM option may be used to connect the hot aisle cabling or the cold aisle cabling to other components. For example, the different BOM option may be used to connect the hot aisle cabling I/O or the cold aisle cabling I/O to the front compute device or the rear compute device.

Figure 4:
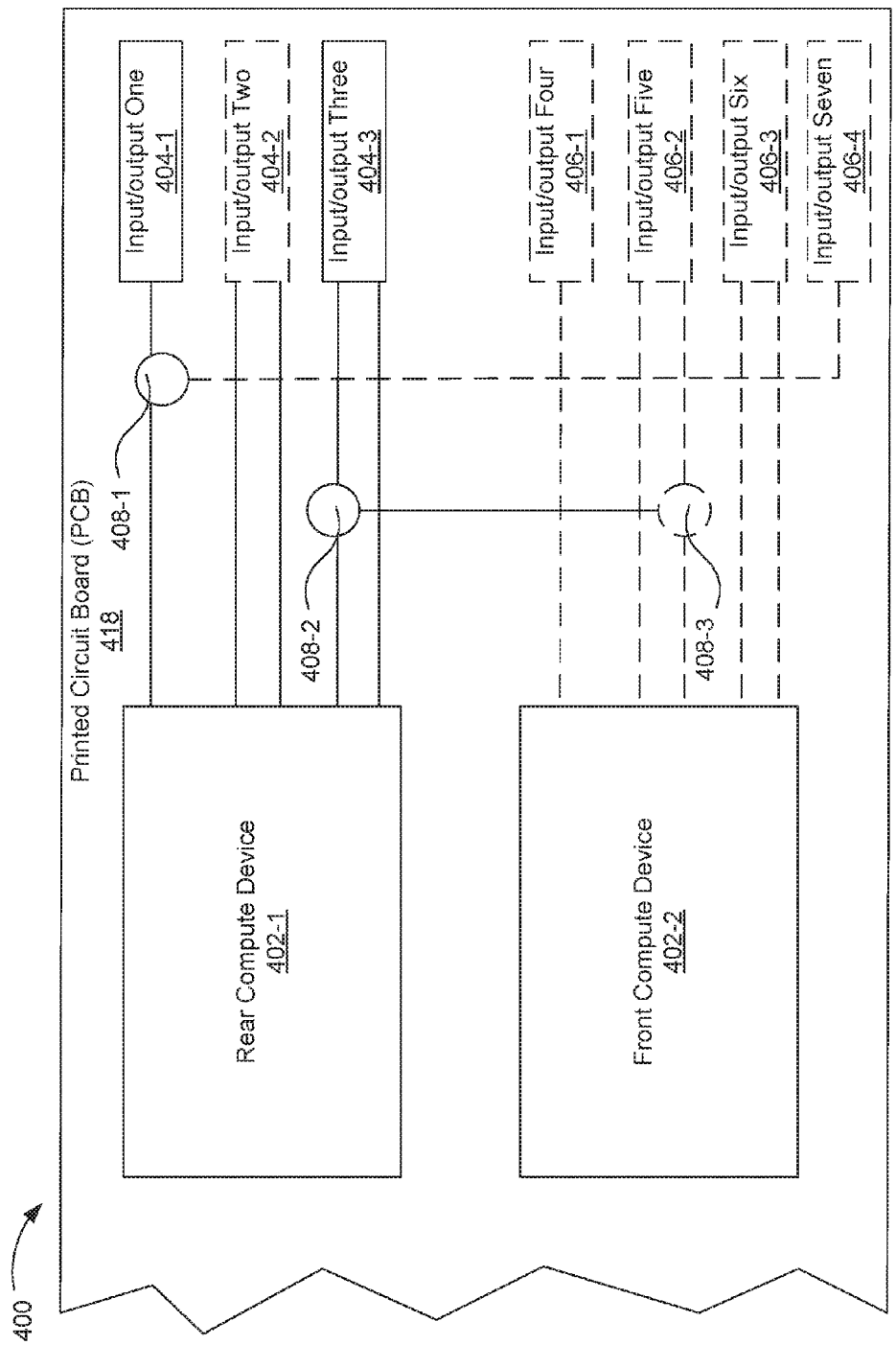
FIG. 4 is a diagram of an example of PCA for a specific customer, according to one example of principles described herein.

FIG. 4 is a diagram of an example of PCA for a specific customer, according to one example of principles described herein. Depending on the intended operation of the PCA, a number of components may or may not be installed on the PCA via the BOM option.

As illustrated in FIG. 4, the PCA (400) may be designed to fit a specific customer's needs. In one example, the dashed lines represent components that are uninstalled on the PCA (400). Further, the solid lines represent components that are installed on the PCA (400). These components may be installed or uninstalled via the BOM options (408).

In this example, a rear compute device (402-1) and a front compute device (402-2) are installed on the PCB (418) to form the PCA (400). Further, BOM option one (408-1) and BOM option two (408-2) are installed on the PCB (418) to further form the PCA (400). BOM option one (408-1) and BOM option two (408-2) are installed such that I/O one (404-1) and I/O three (404-3) are installed on the PCB (418) to form the PCA (400). As a result, the PCA (400) is designed specifically to meet a customer's needs via the BOM options (408) while still using the same layout as the PCA of FIG. 2.

Figure 5:
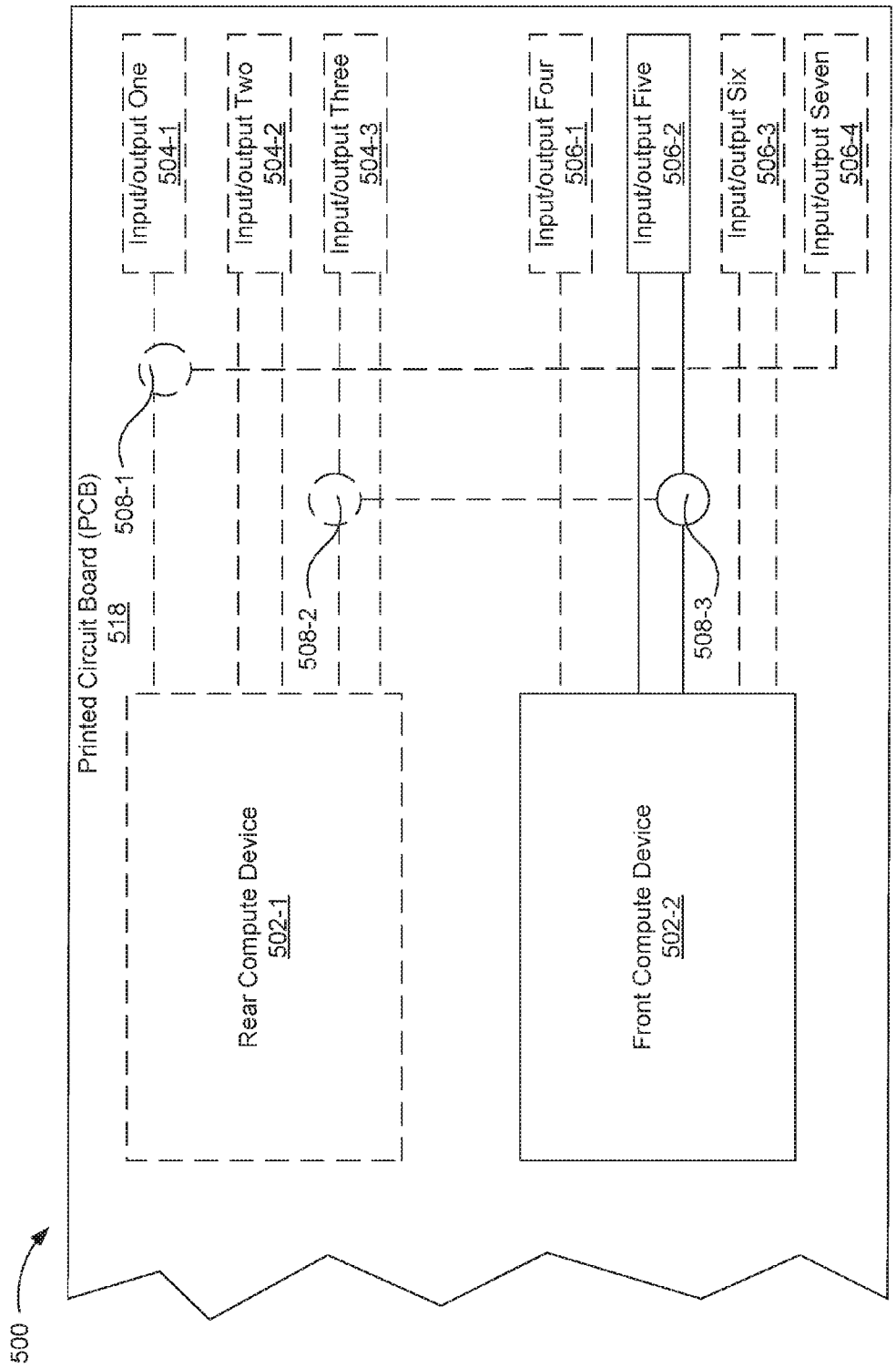
FIG. 5 is a diagram of an example of PCA for a specific customer, according to one example of principles described herein.

FIG. 5 is a diagram of an example of PCA for a specific customer, according to one example of principles described herein. As mentioned above, depending on the intended operation of the PCA a number of components may or may not be installed on the PCA via the BOM options.

As illustrated in FIG. 5, the PCA (500) may be designed to fit a specific customer's needs. In one example, the dashed lines represent components that are uninstalled on the PCA (500). Further, the solid lines represent components that are installed on the PCA (500). These components may be installed or uninstalled via the BOM options (508).

As illustrated, a front compute device (502-2) is installed on the PCB (518) to form the PCA (500). Further, an I/O connector, such as I/O five (506-2), is installed on the PCB (518) to further form the PCA (500). As a result, the PCA (500) is designed specifically to meet a customer's needs via the BOM options (508) while still using the same layout as the PCA of FIG. 2.

Figure 6:
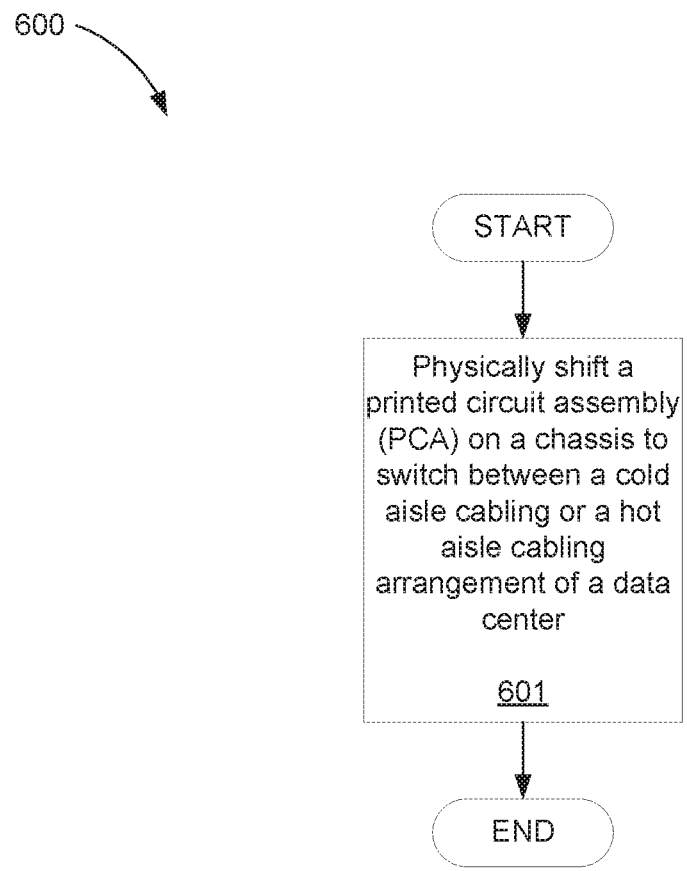
FIG. 6 is flowchart of a method for supporting I/O connectivity for a PCA in a hot aisle cabling or a cold aisle cabling arrangement, according to one example of principles described herein.

FIG. 6 is flowchart of a method for supporting I/O connectivity for a PCA in a hot aisle cabling or a cold aisle cabling arrangement, according to one example of principles described herein. In one example, the method includes physically (601) shifting a PCA on a chassis to switch between a cold aisle cabling or a hot aisle cabling arrangement of a data center.

As mentioned above, the method (600) includes physically (601) shifting a PCA on a chassis to switch between a cold aisle cabling or a hot aisle cabling arrangement of a datacenter. Depending on an arrangement of the data center and the customer's specific needs, the PCA is physically shifted to the front of the chassis for cold aisle cabling or to the rear of the chassis for hot aisle cabling.

For example, a PCA may be slidably connected to a chassis. In one example, a series of trays and/or pans slide into the chassis to accommodate the PCA. In this example, the PCA is installed into a pan/tray and the pan/tray slides in and out of the chassis. The location within the pan/tray specifies where the PCA will reside relative to the chassis. The PCA is secured to the tray and/or pan by screws, latches, or other mechanism. Further, the pan/tray inserts into the chassis and is secured by a latch and/or handle or screws. As mentioned above, the PCA is physically shifted on the chassis to accommodate a cold aisle cabling or a hot aisle cabling arrangement of the data center. In one example, the PCA may be physically shifted via an individual manually shifting the PCA. As mentioned above, the PCA is physically shifted to a rear of the chassis for the hot aisle cabling arrangement of the data center and the PCA is physically shifted to a front of the chassis for the cold aisle cabling arrangement of the data center.

In one example, the PCA may be physically shifted on the chassis because a length of the PCA is less than a length of the chassis to allow the PCA to be physically shifted on the chassis. Further, once the PCA is physically shifted on the chassis, the PCA may be secured to the chassis. For example, the PCA may be secured to the chassis via a number of common methods and techniques such as using a number of screws to secure the PCA to the chassis as mentioned above.

The preceding description has been presented to illustrate and describe examples of the principles described. This description is not intended to be exhaustive or to limit these principles to any precise form disclosed. Many modifications and variations are possible in light of the above teaching.

What is claimed is:

1. A system for supporting input/output (I/O) connectivity for a printed circuit assembly (PCA) in a hot aisle cabling or a cold aisle cabling arrangement, the system comprising:
    a chassis, the chassis being connected to a rack in a data center; and
    a printed circuit assembly (PCA) slidably connected to the chassis via a tray;
    in which the PCA comprises a number of bill of material (BOM) options to customize the PCA and a single basic input/output system (BIOS) image; and
    in which the PCA is physically shifted on the chassis to accommodate a cold aisle cabling or a hot aisle cabling arrangement of the data center.

2. The system of claim 1, in which a length of the RCA is less than a length of the chassis to allow the RCA to be physically shifted on the chassis.

3. The system of claim 2, in which the RCA is physically shifted to a front of the chassis for the cold aisle cabling arrangement of the data center or the RCA is physically shifted to a rear of the chassis for the hot aisle cabling arrangement of the data center.

4. The system of claim 1, in which a length of a Mill bus is minimized for signal integrity, bandwidth, throughput, or combinations thereof of the PCA.

5. The system of claim 1, in which the PCA indicates if a front compute device is in a boot path for a boot strap process or if a rear compute device is in the boot path for the boot strap process.

6. The system of claim 1, in which the number of BOM options allows a change to a power supply of an I/O interface module, the change permitting the power supply to be routed via a main power supply for the cold aisle cabling or the change permitting the power supply to be routed via an auxiliary power supply for the hot aisle cabling.

7. The system of claim 1, in which the number of BOM options comprises shared footprints, the shared footprints allow a front compute device or a rear compute device to connect to a southbridge, support I/O bus connectivity, or combinations thereof.

8. The system of claim 1, in which the PCA further comprises a front compute device, a rear compute device, a direct media interface (DMI) bus, a southbridge, peripheral component interconnect express (PCIe), memory devices, a number of input/output (I/O) connectors to provide I/O balance and affinity for the PCA, a management device, and a power supply.

9. A printed circuit assembly (PCA) supporting input/output (I/O) connectivity in a hot aisle cabling or a cold aisle cabling arrangement, comprising:
   a number of bill of material (BOM) options to customize the PCA,
   a single basic input/output system (BIOS) image, and
   a number of input/output (I/O) connectors to provide I/O balance and affinity for the PCA; and
   in which the PCA is slidably connected to a chassis of a rack via a tray; and
   in which the PCA is physically shifted to a front of the chassis for a cold aisle cabling arrangement of a data center or the PCA is physically shifted to a rear of the chassis for a hot aisle cabling arrangement of the data center.

10. The PCA of claim 9, in which a length of a DMI bus is minimized for signal integrity, bandwidth, throughput, or combinations thereof of the PCA.

11. The PCA of claim 9, in which the number of BOM options allows a change to a power supply of an I/O interface module, the change permitting the power supply to be routed via a main power supply for the cold aisle cabling or the change permitting the power supply to be routed via an auxiliary power supply for the hot aisle cabling.

12. The PCA of claim 9, in which the number of BOM options comprises shared footprints, the shared footprints allow a front compute device or a rear compute device to connect to a southbridge of the PCA and the shared footprints support I/O bus connectivity for the PCA.

13. The PCA of claim 9, in which the PCA indicates if a front compute device is in a boot path for a boot strap process or if a rear compute device is in the boot path for the boot strap process.

14. A method for supporting input/output (I/O) connectivity for a printed circuit assembly (PCA) in a hot aisle cabling or a cold aisle cabling arrangement, the method comprising:
   physically shifting a printed circuit assembly (PCA) on a chassis to switch between a cold aisle cabling or a hot aisle cabling arrangement of a data center;
   in which the PCA comprises a number of bill of material (BOM) options to customize the PCA and a single basic input/output system (BIOS) image; and
   in which the number of BOM options comprises shared footprints, the shared footprints allow a front compute device or a rear compute device to connect to a southbridge of the PCA.

15. The method of claim 14, in which a length of the PCA is less than a length of the chassis to allow the PCA to be physically shifted on the chassis.

\* \* \* \* \*